United States Patent [19]
Yasukawa et al.

[11] Patent Number: 5,606,487
[45] Date of Patent: Feb. 25, 1997

[54] ELECTRONIC DEVICE FOR OFFSETTING ADVERSE EFFECTS OF A PLURALITY OF CHIPS WHICH REPETITIVELY PRODUCE LARGE PULSES OF HEAT

[75] Inventors: Akio Yasukawa, Kashiwa; Noboru Sugiura, Mito, both of Japan

[73] Assignee: Hitachi, Ltd., Tokyo, Japan

[21] Appl. No.: 438,248

[22] Filed: May 10, 1995

Related U.S. Application Data

[63] Continuation of Ser. No. 108,940, Aug. 19, 1993, abandoned, which is a continuation of Ser. No. 731,868, Jul. 18, 1991, abandoned.

[30] Foreign Application Priority Data

Jul. 18, 1990 [JP] Japan ................... 2-187906

[51] Int. Cl.⁶ ............... H05K 7/20; H01L 23/36
[52] U.S. Cl. ........... 361/707; 361/719; 257/717; 257/748
[58] Field of Search ............... 257/587, 705, 257/706, 712, 717, 723, 724, 725, 747, 748; 361/704, 707, 710, 714, 719, 730, 751, 715, 717, 718, 722; 29/840; 174/16.3

[56] References Cited

U.S. PATENT DOCUMENTS

| | | | |
|---|---|---|---|
| 4,427,993 | 1/1984 | Fichot et al. | 257/747 X |
| 4,556,899 | 12/1985 | Kurihara et al. | 257/747 |
| 4,811,166 | 3/1989 | Alvarez et al. | 361/386 |
| 4,878,152 | 10/1989 | Sauzade et al. | 361/386 |
| 4,907,125 | 3/1990 | Drekmeier et al. | 361/386 |

FOREIGN PATENT DOCUMENTS

| | | |
|---|---|---|
| 0015053 | 1/1980 | European Pat. Off. |
| 0194475 | 2/1986 | European Pat. Off. |
| 3144759A1 | 6/1982 | Germany |
| 3221199A1 | 1/1983 | Germany |
| 840005404 | 1/1984 | Japan |
| 1-106451 | 4/1989 | Japan |

*Primary Examiner*—Michael W. Phillips
*Attorney, Agent, or Firm*—Antonelli, Terry, Stout & Kraus, LLP

[57] ABSTRACT

An electronic device is formed by connecting a wiring plate and insulating plates mounting semiconductor chips to a base. A composite material plate, which is made by combining materials having different linear thermal expansion coefficients, is inserted between the base and the insulating plates through solders. The thickness ratio ($h_a/h_b$) of the materials of the composite material plate is selected in such a manner that strain in the solder between the base and the composite material plate is equal to the strain in the solder between the insulating plate and the composite material plate. In accordance with one embodiment of the invention, a single insulating plate is provided for mounting a plurality of semiconductor chips. The single insulating plate and the wiring plate, are arranged relative to one another on the base so that the centers of the single insulating plate and of the wiring plate are aligned with one another along a line corresponding to an axis of the single insulating plate and perpendicular to the width direction thereof. This serves to reduce the shift of the centers which might otherwise occur due to thermal deformation.

20 Claims, 8 Drawing Sheets

ELECTRONIC DEVICE FOR OFFSETTING ADVERSE EFFECTS OF A PLURALITY OF CHIPS WHICH REPETITIVELY PRODUCE LARGE PULSES OF HEAT

This application is a continuation of application Ser. No. 108,940 filed on Aug. 19, 1993, now abandoned, which is a continuation of application Ser. No. 731,868, filed on Jul. 18, 1991 now abandoned.

FIELD OF THE INVENTION

The present invention relates to an electronic device and an engine ignition apparatus using the electronic device. More specifically, this invention relates to an electronic device and an engine ignition apparatus using it, which properly prevent performance deterioration and reduction in longevity of power semiconductor chips (simply referred to as chips) mounted on an insulating plate when the chips are subjected to large repetitive pulse-like thermal stresses.

BACKGROUND OF THE INVENTION

As an example of the prior art electronic device of this kind, FIG. 9 of Japanese Patent Laid-Open No. 1-106451 published on Apr. 24, 1989 and entitled "Insulating plate for semiconductor element" may be cited. The conventional electronic device proposed in this publication, as shown in FIGS. 6 and 7 of the present specification, has a wiring plate 19 and insulating plates 2a–2d joined to a base 4. Each of the insulating plates 2a–2d has a chip 1 mounted thereon, which is electrically connected through wire 14b to the wiring plate 19. FIG. 6 does not show intermediate chips and wiring for simplicity.

The prior art device employs a single wiring plate as the wiring plate 19 while the insulating plate 2a–2d is divided and separated into the same number of plates as that of the chips 1.

Further, in the prior art device, as shown in FIG. 9, the insulating plates (represented by reference numeral 2' in FIG. 9) are joined directly to the base 4 by a solder 5b. The base 4 is generally formed of a metal plate and the insulating plates 2' are formed of alumina and the like. Hence, the base 4 and the insulating plates 2' have different linear expansion coefficients.

As mentioned above, the conventional devices have the insulating plate divided into the same number 2a–2d as that of the chips 1, as shown in FIG. 6. Thus, when a pulse-like heat stress occurs in a chip 1, for example in the chip 1b mounted on the insulating plate 2b of FIG. 7, the generated heat is not dissipated but is contained within the insulating plate 2b. That is, the heat cannot be absorbed by the insulating plate 2b alone on which the chip 1b that has produced heat is mounted, resulting in an abnormal increase in temperature of the chip 1b. This is turn causes the insulating plate on which the heat-generating chip 1 is mounted to deform greatly as indicated by broken lines in FIG. 6. Each time the insulating plate deforms, the wire 14b interconnecting the wiring plate 19 and the chip 1 is also deformed greatly. As the chip 1 repetitively produces heat, the wire 14b is subjected to a repetitive load resulting in a fatigue fracture. In other words, the conventional devices have a drawback of short longevity.

In the prior art, although the linear expansion coefficients of the base 4 and the insulating plates 2a–2d are different, the insulating plates 2a–2d are directly joined to the base 4 by the solder 5b as shown in FIG. 9. Let us compare the conditions before and after the temperature rises, the former being represented by FIG. 9 and the latter by FIG. 10. When, for example, the linear expansion coefficient of the base 4 is very large and that of the insulating plate (representatively shown by reference numeral 2') is small, there is a big difference in the thermal expansion between the base 4 and the insulating plate 2'. The strain of the solder 5b joining the base 4 and the insulating plate 2' therefore becomes large. If the solder 5b produces this strain repetitively, it is fractured through fatigue, thus reducing the life of the device.

Particularly with electronic devices installed in an engine room of automobiles, these problems are critical because the devices undergo large temperature changes due to heat from the engine.

Further, in an electronic apparatus that controls ignition of the engine, a plurality of chips produce large pulses of heat in turn as each chip enters the ignition sequence. However, when the conventional electronic device is used for the engine ignition apparatus, it cannot effectively dissipate or absorb the heat produced during the ignition, subjecting the chips to high temperatures, which in turn gives rise to a problem of significant performance deterioration and reduced life of the electronic device.

SUMMARY OF THE INVENTION

A first object of the invention is to provide an electronic device which, when a pulse of heat is generated, can properly dissipate or absorb the heat by the insulating plate.

A second object of the invention is to provide an electronic device which can significantly reduce a strain of the solder between the base and the insulating plate when the linear expansion coefficients of the base and the insulating plate are different from each other.

A third object of the invention is to provide a reliable ignition apparatus for an engine, which can prevent performance deterioration of the chips even when large pulses of heat are generated in the chips upon each ignition of the engine and which can prolong the longevity of the apparatus as a whole.

The first object mentioned above can be achieved by joining a single insulating plate to the base and mounting all the necessary chips on the insulating plate.

The first object can better be achieved by an electronic device which comprises: a base; a single insulating plate joined to the base; a single wiring plate, having a width greater than that of said single insulating plate, joined (mounted) to the base at a specified distance from the single insulating plate; a plurality of small-signal electronic parts, all mounted on the wiring plate, to form electronic circuits; and a plurality of chips, all mounted on the insulating plate, said chips and said electronic circuits including the small-signal electronic parts being interconnected through wires.

The second object can be achieved by an electronic device in which the base and the insulating plate are joined together with a composite material plate interposed, said composite material plate being formed of a combination of materials with different linear expansion coefficients.

The second object can also be achieved by an electronic device in which a solder is used to join the facing surfaces of the base and the composite material plate and of the insulating plate and the composite material plate, and the ratio of the thickness of the plate in the combination of materials in the composite material plate is so set that the strain of the solder between the base and the composite material plate is equal to the strain of the solder between the insulating plate and the composite material plate.

The second object can also be achieved by an electronic device, in which the composite material plate is formed by combining a material with a large linear expansion coefficient and a material with a small linear expansion coefficient, and a thickness ratio $h_a/h_b$ between the thickness of the material with the large linear expansion coefficient $h_a$ and the thickness of the material with the small linear expansion coefficient $h_b$ is rationally set by a formula mentioned later involving the moduli of longitudinal elasticity and linear expansion coefficients of both materials of the composite material plate, and the linear expansion coefficients of the insulating plate and the base.

The second object can also be achieved by an electronic device, in which the base is formed of copper (Cu), the insulating plate is formed of aluminum nitride (AlN), and the base and the insulating plate are joined together with a clad plate interposed therebetween, said clad plate being formed of a combination of a Cu plate and an INVAR plate with a thickness ratio between the Cu plate and the INVAR plate in the range of 1.3 to 2.3. It is noted that the term INVAR is a trademark for acommercially available low-expansion alloy comprised of 36% nickel, 0.35% manganese, and the balance of iron with copper and other elements.

Further, the second object can be achieved by an electronic device, in which the base is formed of aluminum (Al), the insulating plate is formed of aluminum nitride (AlN), and the base and the insulating plate are joined together with a clad plate interposed, said clad plate being formed of a combination of a Cu plate and an INVAR plate with a thickness ratio between the Cu plate and the INVAR plate in the range of 4 to 11.

Furthermore, the second object can better be achieved by an electronic device, in which the base and the insulating plate are joined together with a coefficient-graded material plate interposed therebetween. One side of the coefficient-graded material plate near the base has a linear expansion coefficient close to that of the base, and the other side, near the insulating plate, has a linear expansion coefficient close to that of the insulating plate. The intermediate portion between the two sides has the linear expansion coefficient which is gradually changed.

The third object can be achieved by using the electronic device mentioned above as a power switch which passes a large pulse current to ignition coils and in which the chips mounted on the insulating plate are separately connected to the corresponding ignition coils.

As the first means for attaining the first object, the device of the present invention is formed in such a manner that all the necessary chips are mounted on a single insulating plate joined to the base. The heat generated in the chips, therefore, can be dissipated and absorbed into a large volume of the insulating plate, minimizing the temperature rise and thereby preventing performance deterioration of the chip due to heat. This invention also minimizes the reciprocal motion of the insulating plate with respect to the wiring plate, which would result from the temperature rise and fall. This in turn significantly reduces the repetitive load on the wires that connect the electronic circuits on the wiring plate to the chips on the insulating plate, extending the fatigue life of the wires.

As the second means for attaining the first object, the device of the present invention is formed in such a manner that a single wiring plate and a single insulating plate are joined to the base. On the wiring plate all the necessary numbers of the small-signal electronic parts are mounted to form electronic circuits. All the necessary numbers of the chips are mounted on the single insulating plate. The electronic circuits including the small-signal electronic parts are connected to the corresponding chips through wires. With this invention also, the heat generated by the chips can be dissipated and absorbed into a large volume of the insulating plate, preventing performance deterioration of the chips due to heat. This invention also minimizes the reciprocal motion of the insulating plate with respect to the wiring plate, which would result from the temperature rise and fall, so that the repetitive load on the wires that connect the electronic circuits on the wiring plate to the chips on the insulating plate can significantly be reduced, extending the fatigue life of the wires.

As the first means for attaining the second object, the device of the present invention is formed in such a manner that the base and the insulating plate are joined together with a composite material plate interposed, the composite material plate being formed of a combination of materials with different linear expansion coefficients. As a result, when the base and the insulating plate are formed of materials with different linear expansion coefficients and when the insulating plate absorbs heat from the chips and its temperature rises, the thermal expansion difference between the base and the insulating plate can be absorbed by the composite material plate. Thus, the repetitive strain, to which the joint between the base and the insulating plate is subjected when there is an expansion difference between the two members, can be limited to a very small amount, substantially extending the fatigue life of the joint between the base and the insulating plate.

As the second means for attaining the second object, the device of the present invention is formed in such a manner that the solder is used to join the facing surfaces of the base and the composite material plate and of the insulating plate and the composite material. The combination of materials in the composite plate is so set that the strain of the solder between the base and the composite material plate is equal to the strain of the solder between the insulating plate and the composite material plate. As a result, the strain of the solder between the base and the insulating plate can further be reduced by the composite material plate inserted therebetween, drastically extending the fatigue life of the solder.

As the third means for attaining the second object, the device of the present invention is formed in such a manner that the composite material plate is formed of a combination of materials, one with a small linear expansion coefficient and one with a large linear expansion coefficient. The thickness ratio $h_a/h_b$ between the thickness of the large linear expansion coefficient material $h_a$ and the thickness of the large small expansion coefficient material $h_b$ is rationally set by a formula involving the moduli of longitudinal and linear expansion coefficient of both materials elasticity of the composite material plate, and the linear expansion coefficients of the insulating plate and the base.

As the fourth means for attaining the second object, the device of the present invention is formed in such a manner that the base is formed of Cu, the insulating plate is formed of AlN, and the base and the insulating plate are joined together with a clad plate interposed therebetween, the clad plate being formed of a combination of a Cu plate and an INVAR plate with a thickness ratio between the Cu plate and the INVAR plate in the range of 1.3 to 2.3.

As the fifth means for attaining the second object, the device of the present invention is formed in such a manner that the base is formed of Al, the insulating plate is formed of AlN, and the base and the insulating plate are joined together with a clad plate interposed therebetween, the clad plate being formed of a combination of a Cu plate and an INVAR plate with a thickness ratio between the Cu plate and the INVAR plate in the range of 4 to 11.

As the sixth means for attaining the second object, the device of the present invention is formed in such a manner that the base and the insulating plate are joined together with a coefficient-graded material plate interposed therebetween, which has on one side, near the base, a linear expansion coefficient close to that of the base and, on the other side, near the insulating plate, has a linear expansion coefficient close to that of the insulating plate. The intermediate portion between the two sides has the linear expansion coefficient which is gradually changed. This arrangement permits a significant reduction in the strain of the solder between the base and the insulating plate and thereby further extends the fatigue life of the solder subjected to the repetitive strain, even when the base and the insulating plate are formed of material with different linear expansion coefficients.

For attaining the third object, the device of the present invention uses the the electronic device mentioned in any one of the device for obtaining the first and second objects as a power switch, in which the chips of the electronic device are separately connected to the corresponding ignition coils. At each ignition of the engine, a large pulse of heat is produced in a chip, raising its temperature.

When the electronic device explained as the first means for attaining the first object is used as the power switch, the heat generated in the chip flows into a vast volume of the insulating plate and is dissipated and absorbed by it. Thus, the performance deterioration of the chips can be prevented. Further, since the repetitive load, to which the wires connecting the electronic circuits on the wiring plate to the chips on the insulating plate are subjected, can be minimized, the fatigue life of the wires can be extended.

Also, when the electronic device explained as the second means for attaining the first object is used as a power switch, the heat generated in the chip can be dissipated and absorbed into a large volume of the insulating plate, so that the performance degradation of chips due to heat can be prevented. Furthermore, this device reduces the repetitive load on the wires connecting the electronic circuits on the wiring plate to the chips on the insulating plate, the repetitive load being caused by the reciprocal motion of the insulating plate with respect to the wiring plate as the temperature rises and falls. This in turn extends the fatigue life of the wires.

Furthermore, when the electronic device for attaining the second and third objects is used as the power switch, there are the following advantages. That is, when the base and the insulating plate are formed of materials with different linear expansion coefficients and the power switch is used in the high-temperature environment in an engine room, and when the heat generated in the chips flows into the insulating plate, the composite material plate can adequately absorb the thermal expansion difference between the base and the insulating plate, thereby increasing fatigue life of the solder between the base and the insulating plate subjected to the repetitive strain.

DETAILED DESCRIPTION OF THE PREFERRED EMBODIMENTS

Figure 1:
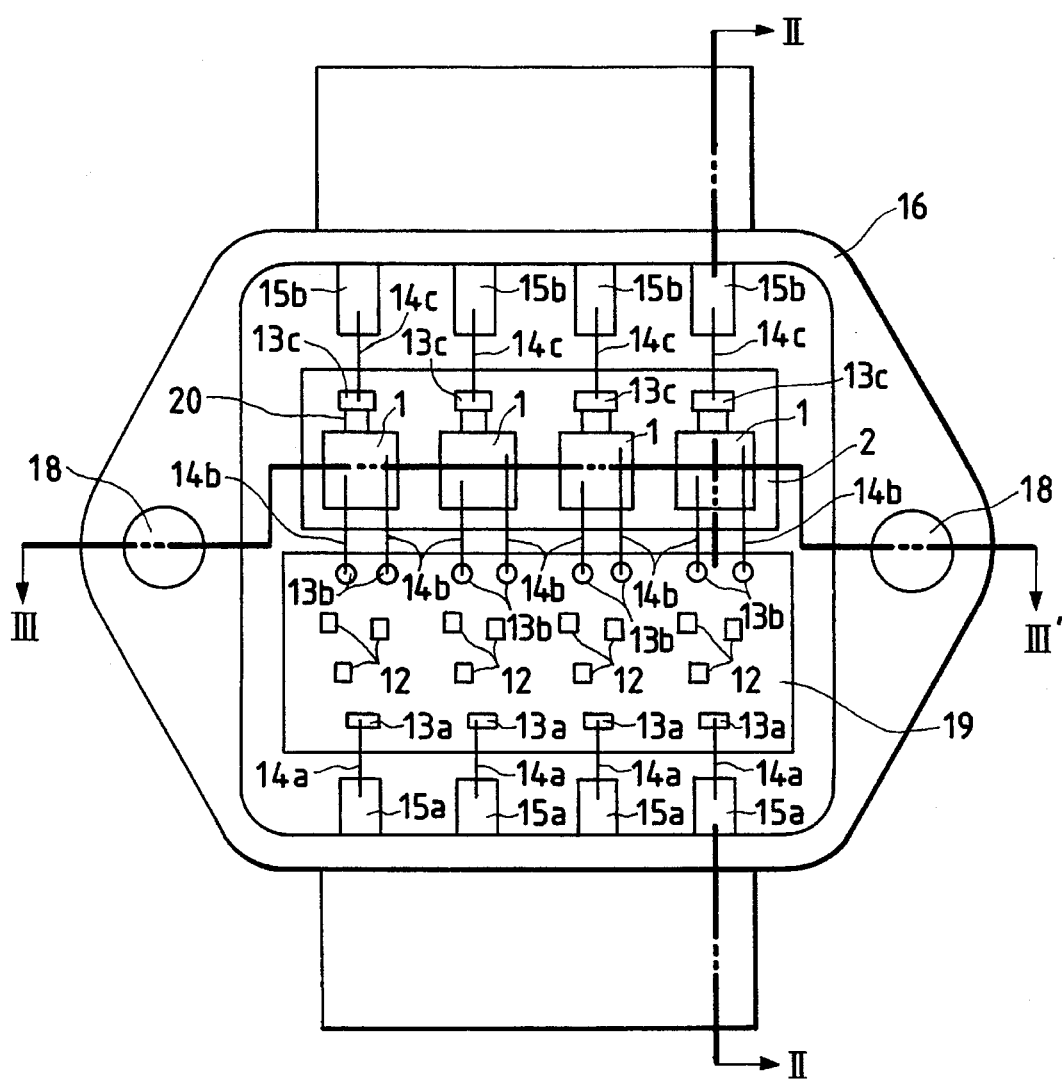
FIG. 1 is a plan view of the entire electronic device of one embodiment of the present invention in which a cover is removed.
Figure 2:
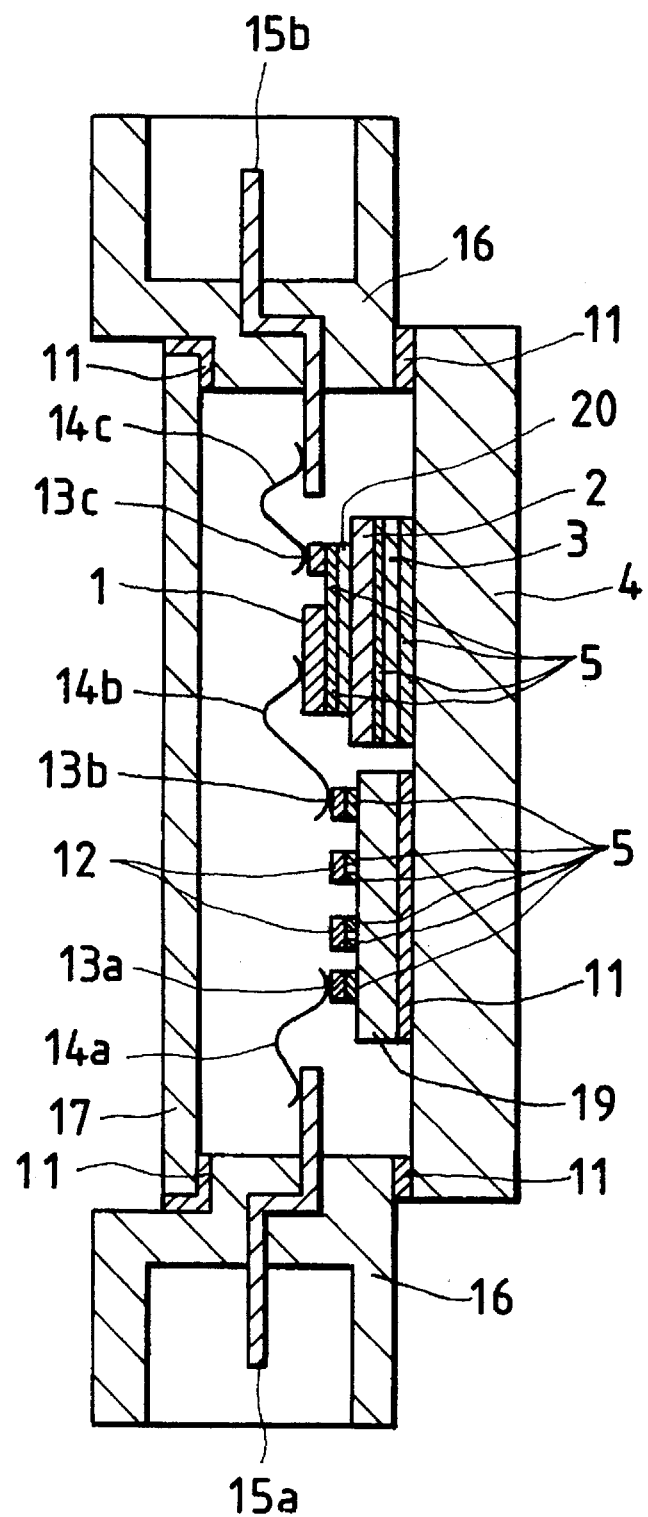
FIG. 2 is a side vertical cross section along the line II–II' shown in FIG. 1.
Figure 3:
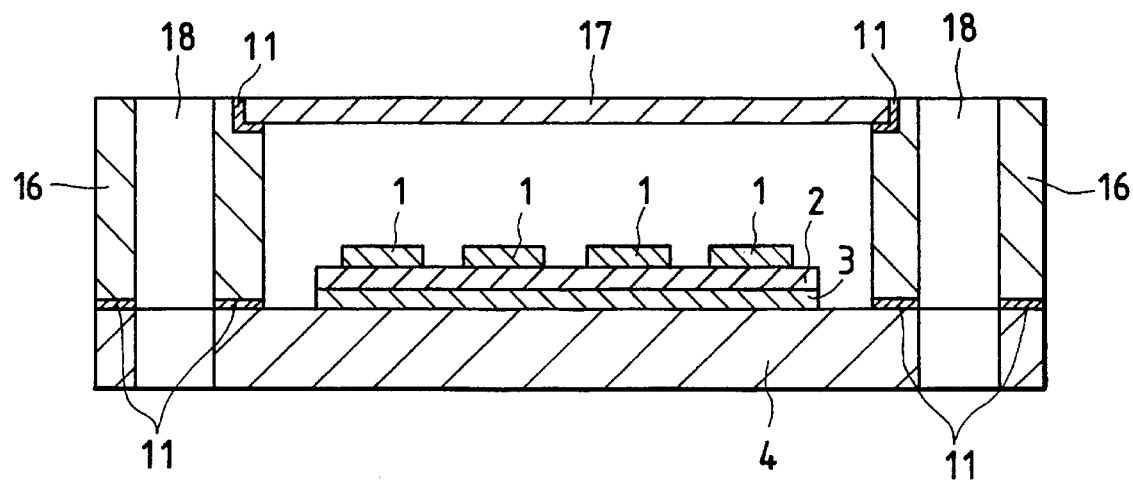
FIG. 3 is a front vertical cross section along the line III–III' shown in FIG. 1.
Figure 4:
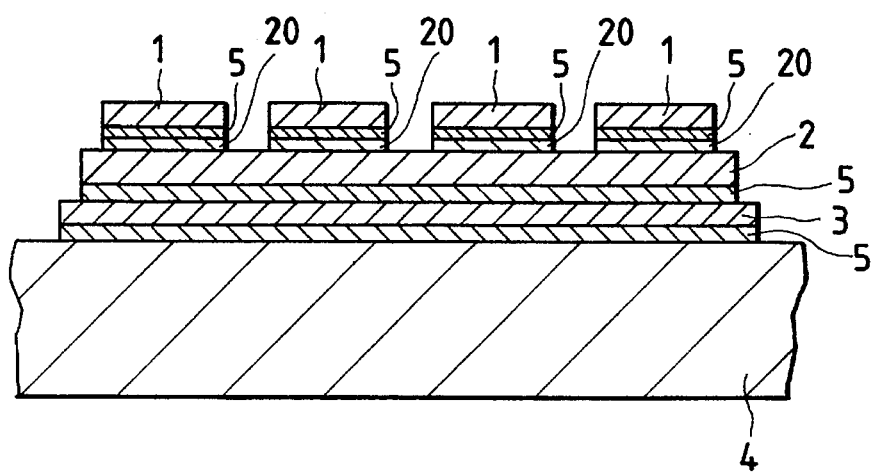
FIG. 4 is a partial enlarged, front vertical cross section of an essential portion of FIG. 3.

Referring to FIGS. 1 to 3, the electronic device of the embodiment of the present invention comprises a base 4; a composite material plate 3 joined to the surface of the base 4 with solder 5; a single insulating plate 2 joined to the surface of the composite material plate 3 with solder 5; a plurality of strips of metalized layer 20 (four strips shown in the figures) formed on the surface of the insulating plate 2; plural sets of chips 1 and pads 13c (four sets-shown in the figures) joined to the surface of each metalized layer 20 by solder 5; a single wiring plate 19, material 11; a plurality of pads 13a (four in the figures), small-signal electronic components 12 (twelve in the figures) and pads 13b (four in the figures), all bonded to the surface of the wiring plate 19 by solder 5; a case 16 bonded to the base 4 by bonding material 11; and a cover 17 attached to an opening of the case 16.

The base 4 is made of a metal with a good heat conductivity, such as copper (Cu) and aluminum (Al). It should be noted that since the copper and aluminum has very large linear expansion coefficients compared with ceramics, reduction of thermal stresses becomes an important factor.

The single insulating plate 2, which has a width (measured along the horizontal direction in FIG. 1) narrower than that of the wiring plate 19, is formed of a ceramic which has a good insulating performance and a linear expansion coefficient that matches those of the chips 1 and pads 13c mounted on the surface of the insulating plate 2. More specifically, $Al_2O_3$ (aluminum oxide) is often used. The use of AlN (aluminum nitride) is more desirable as it has a better heat conductivity. There is only one insulating plate 2 mounted on the surface of the base 4 and bonded to it by solder 5.

Figure 5:
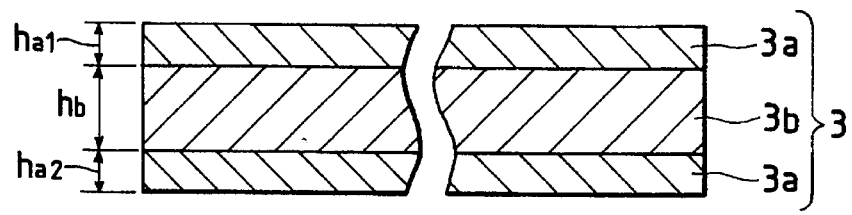
FIG. 5 is an enlarged, front vertical cross section of a composite material plate inserted between the base and the insulating plate.
Figure 6:
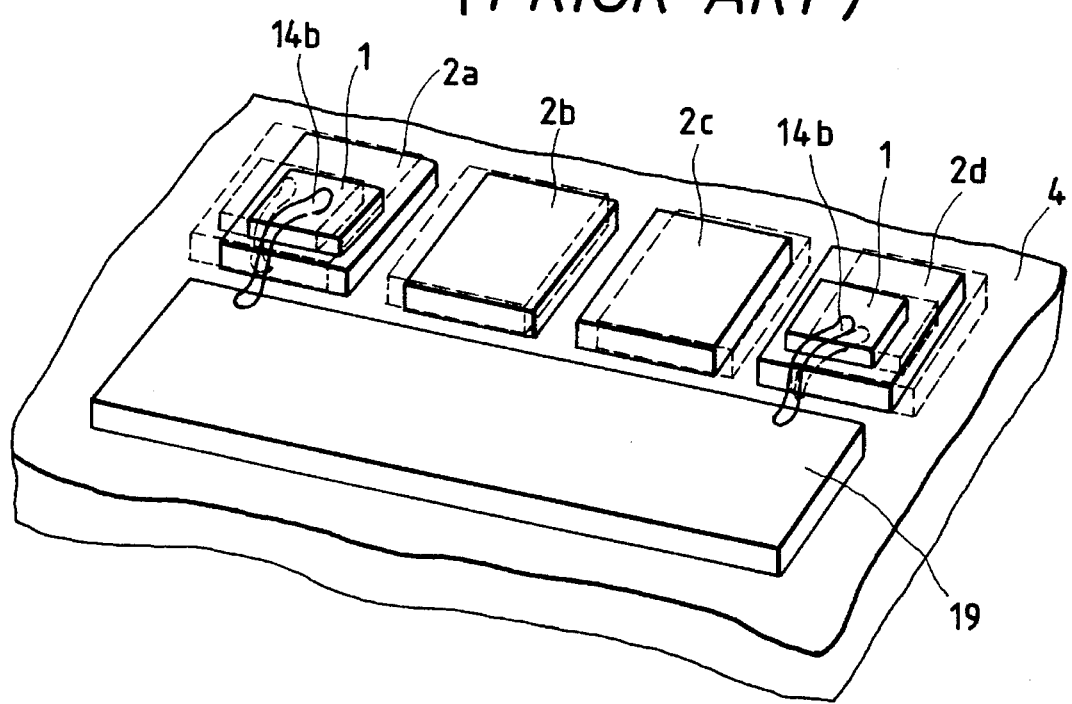
FIG. 6 is a perspective view showing a part of the conventional electronic device.

The composite material plate 3 is made by combining materials of different linear expansion coefficients. In this embodiment, as shown in FIG. 5, a material 3b with a small linear expansion coefficient is clad with two layers of material 3a with a larger linear expansion coefficient by interposing the first material between the latter. The above-mentioned cladding can take place in such a manner that the plates are layered and then rolled. The material 3a with a large linear expansion coefficient includes copper and the material 3b with a smaller linear expansion coefficient includes INVAR. The ratio between the thickness $h_a$ (ha= $h_{a1}+h_{a2}$) of the large linear expansion coefficient material 3a and the thickness $h_b$ of the smaller linear expansion coefficient material 3b, i.e. $h_a/h_b$, is preferably set according to equation (1) below.

$$\frac{h_a}{h_b} = \frac{E_b(\alpha_2 + \alpha_4 - 2\alpha_b)}{E_a(2\alpha_a - \alpha_2 - \alpha_4)} \quad (1)$$

where $E_a$: Modulus of longitudinal elasticity of the large linear expansion coefficient material that makes up the composite material plate;

$E_b$: Modulus of longitudinal elasticity of the small linear expansion coefficient material that makes up the composite material plate;

$\alpha_a$: Linear expansion coefficient of the large linear expansion coefficient material that makes up the composite material plate;

$\alpha_b$: Linear expansion coefficient of the small linear expansion coefficient material that makes up the composite material plate;

$\alpha_2$: Linear expansion coefficient of the insulating plate; and $\alpha_4$: Linear expansion coefficient of the base.

Let us consider a case Cu is used for the large linear expansion coefficient material 3a of the composite material plate 3 of FIG. 5, INVAR is used for the small linear expansion coefficient material 3b, AlN or $Al_2O_3$ is used for the insulating plate 2, and Cu or Al is used for the base 4. The linear expansion coefficients of Cu, INVAR, AlN, and $Al_2O_3$, and Al though they vary somewhat according to the manufacturing conditions, are 16 to $17 \times 10^{-6} K^{-1}$, 1 to $2 \times 10^{-6} K^{-1}$, 3.9 to $4.9 \times 10^{-6} K^{-1}$, 6 to $7 \times 10^{-6} K^{-1}$, and 23.1 to $24.1 \times 10^{-6} K^{-1}$, respectively. Substituting these values into equation (1) yields the appropriate thickness ratio $h_a/h_b$ of Cu and INVAR that make up the composite material plate 3, as follows.

(i) When the insulating plate 2 is formed of AlN and the base 4 of Cu, $h_a/h_b$=1.3 to 2.3;

(ii) When the insulating material 2 is formed of $Al_2O_3$ and the base of Cu, $h_a/h_b$=1.8 to 3.2;

(iii) When the insulating material 2 is formed of $Al_2O_3$ and the base of Al, $h_a/h_b$=6 to 38; and (iv) When the insulating material 2 is formed of AlN and the base of Al, $h_a/h_b$=4 to 11.

Hence, when the INVAR of the composite material plate 3 is made 0.1 mm thick, and the insulating plate is made of AlN and the base 4 is made of Cu, the thickness of Cu in the composite material 3 will be 0.13–0.23 mm and the overall thickness of the composite material plate 3 will be 0.23–0.33 mm.

The solder 5 used for joining the base 4 and the composite material plate 3 and for joining the composite material plate 3 and the insulating plate 2 is a lead-tin alloy. The lead-tin alloy solder has a good heat conductivity conductive to dissipating heat generated in the chip 1.

The chip 1 is a power transistor chip formed of monocrystal silicon (Si).

The sets of chips 1 and pads 13c are joined by solder 5 to the metalized layer 20, which is formed on the surface of the insulating plate 2. This reduces the loss produced by a resistance of the metalized layer 20 against the current flowing between the chip 1 and the pad 13c.

The metalized layer 20 is constricted between the chip 1 and the pad 13c so as to allow the chip 1 and the pad 13c to be positioned in place by the surface tension of the solder 5.

There is only one wiring plate 19, as shown in FIG. 1 and FIG. 2, mounted and bonded by the bonding material 11 to the surface of the base 4. The wiring plate 19, like the insulating plate, has a good insulation characteristic and is formed of such material as $Al_2O_3$ or AlN whose linear expansion coefficient matches those of components mounted thereon.

The bonding material 11 for the base 4 and the wiring plate 19 uses a silicone rubber which has an excellent flexibility, to absorb the thermal expansion difference between the base 4 and the wiring plate 19.

As shown in FIG. 1 and FIG. 2, the wiring plate 19 has mounted on its surface the following components. Small-signal electronic parts 12 are joined by solder 5 to the central strip-like area of the wiring plate 19; a plurality of pads 13a (in this case four) are joined by solder 5 to the surface of the wiring plate 19 near the side opposite to the insulating plate 2; and a plurality of pads 13b (in this case eight) are joined by solder 5 to the wiring plate surface near the side close to the insulating plate 2. The small-signal electronic parts 12 form a major component of electronic circuits that prevent overcurrent in the chips 1. The corresponding pads 13a, small-signal electronic parts 12 and pads 13b are electrically interconnected with conductors formed in the wiring plate 19.

As can be seen in the embodiment of FIG. 1, the centers of the wiring plate 19 and the single insulating plate 2 are substantially aligned with one another along a line corresponding to an axis of the single insulating plate and perpendicular to the width direction thereof. The advantage of this is that it serves to decrease the amount of relative shift of the centers of these respective plates which would otherwise be caused by thermal deformation.

The case 16, as shown in FIGS. 1 to 3, is so shaped that it encloses the insulating plate 2, members mounted on it, the wiring plate 19 and members mounted on the plate 19. The case 16 has a plurality of terminals 15a (in this case four) embedded in its side near the wiring plate 19. The case 16 also has a plurality of terminals 15b (in this case four) embedded in the opposite side near the insulating plate 2. Bolt holes 18 are formed in the case 16. The case 16 is bonded to the base 14 by the bonding material 11 and is mounted to a mounting portion of, say, an engine body by passing bolts (not shown) through the bolt holes 18 and screwing them into the mounting portion. Resin such as silicone gel may be potted in the case 16 to prevent ingress of water into parts and thereby improve the humidity resistance.

The terminals 15a embedded in the case 16 are connected to the pads 13a on the wiring plate 19 through wires 14a. The pads 13b on the wiring plate 19 and the chips 1 on the insulating plate 2 are interconnected by wires 14b. Further, the pads 13c mounted on the insulating plate 2 and the terminals 15b embedded in the case 16 are interconnected by wires 14c. The wires 14a, 14c are formed of nickel (Ni) and these Ni wires are resistance-welded to produce a high strength. The wires 14b, on the other hand, are made of aluminum (Al) and ultrasonic bonding is used so as not to damage the chip 1.

The cover 17, as shown in FIGS. 2 and 3, is mounted at the opening of the case 16 and also bonded to the case 16 by bonding material 11.

In the electronic device of the above embodiment, when a signal is supplied from a control unit (not shown) such as computer, the signal is transmitted from the terminal 15a to wire 14a, pad 13a, small-signal electronic part 12, pad 13b, wire 14b and then to the chip 1. From the chip 1, the signal is further transferred to the pad 13c and wire 14c and to the terminal 15b, turning on or off a large current that flows through the terminal 15b. When this electronic device is used as a power switch for an ignition apparatus for engine, the large current flows through the terminal 15b to an ignition coil at an appropriate timing, causing the ignition plug of each cylinder of the engine to spark. At this time, the electronic circuits including the small-signal electronic parts 12 mounted on the wiring plate 19 prevent excessive current from flowing into the chip 1.

Next, the operation of the electronic device of this embodiment will be explained by comparing it with the conventional electronic device in conjunction with FIGS. 7 through 14.

Figure 7:
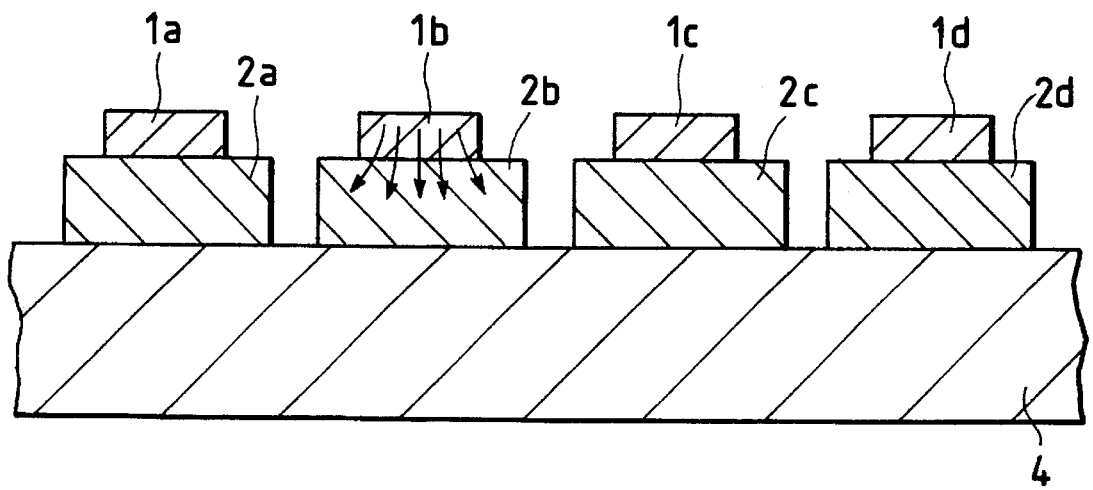
FIG. 7 is schematic cross section showing the flow of heat from the chip to the insulating plate in the conventional electronic device.

In the prior art electronic device, as shown in FIG. 7, the insulating plate is divided into four separate insulating plates 2a, 2b, 2c, 2d, the number of the insulating plates corresponding to that of the chips 1a, 1b, 1c, 1d. Hence, when for example a heat pulse is generated in the second chip 1b from the left in FIG. 7, the diffusion of heat is limited to the insulating plate 2b on which the chip 1b in question is mounted. Thus, the temperature of the chip easily rises.

In the electronic device of this invention, on the other hand, all the chips 1a, 1b, 1c, 1d are mounted on a single insulating plate 2. Therefore, when for instance a heat pulse is produced in the second chip 1b from the left in FIG. 8, the heat diffuses into the entire area of the insulating plate 2. Since the heat is dissipated and absorbed into a large volume of the insulating plate 2, the temperature rise in the chip can be minimized.

Generally, the base 4 is made of material whose linear expansion coefficient is large and the insulating plate 2 or 2a–2d and the wiring plate 19 are made of material with a small linear expansion coefficient.

In the conventional electronic device, when the chip is heated, the heat dissipation into the insulating plate is limited, increasing the temperature of the insulating plate. As the temperature of the insulating plate increases, the insulating plate shifts its position largely relative to the wiring plate because of the difference in the thermal expansion between the base and the insulating plate. As the temperature rise and fall is repeated, the insulating plate performs a reciprocal motion with respect to the wiring plate, applying a repetitive load to the wires connecting the pads on the wiring plate and the chips on the insulating plate. This results in a premature breakage of wire due to fatigue.

Figure 8:
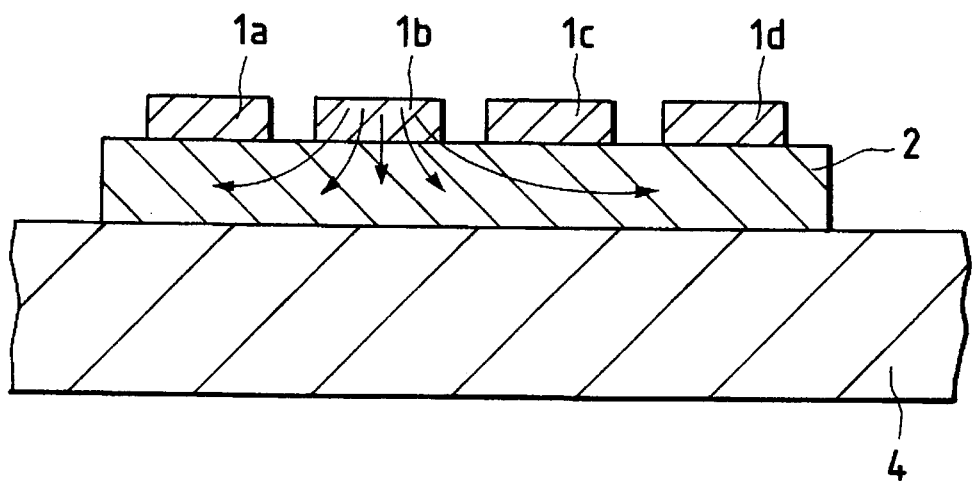
FIG. 8 is schematic cross section showing the flow of heat from the chip to the insulating plate in the electronic device of the present invention.

In this respect, with the electronic device of this embodiment, when any of the chips 1a1d in FIG. 8 becomes heated, the heat is dissipated into a large volume of the insulating plate 2, minimizing a temperature rise and preventing the performance deterioration of the chip 1 due to temperature rise. Further, since the relative shift of the insulating plate 2 with respect to the wiring plate 19 due to the thermal expansion difference between the base 4 and the insulating plate 2 can be significantly reduced, the repetitive load applied to the wires 14b connecting the pads 13b on the wiring plate 19 and the chips 1 in FIGS. 1 to 3 can also be greatly reduced. This in turn extends the life of the wires 14b.

In this embodiment, the insulating plate 2 and the wiring plate 19 are separated. This arrangement makes it difficult for heat generated in the chip 1 to flow into the wiring plate 19, thus preventing the temperature rise of components mounted on the wiring plate 19, which in turn prevents characteristic degradation or shortening of life of components due to temperature rise.

Generally, the chip 1 and the insulating plate 2 both have relatively small linear expansion coefficients, which are close to each other. However, the linear expansion coefficient of the base 4 is much larger than that of the insulating plate 2 or 2'.

Figure 9:
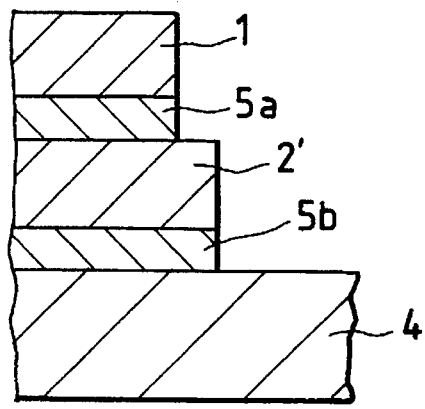
FIG. 9 is partially enlarged side vertical cross section showing the condition of the conventional electronic device before the temperature rises.

In the conventional electronic device, as shown in FIG. 9, the insulating plate 2' is directly joined to the base 4 by solder 5a. As is evident from FIGS. 9 and 10, the thermal expansion difference between the chip 1 and the insulating plate 2' is small and the resulting deformation of the solder 5a connecting both members is also small. On the other hand, the thermal expansion difference between the base 4 and the insulating plate 2' is large and the strain of the solder 5b joining both members is also large. Therefore, if the temperature rise and fall is repeated, the solder 5b connecting the base 4 and the insulating plate 2 is repetitively strained, resulting in a premature break in a short period of time.

Figure 11:
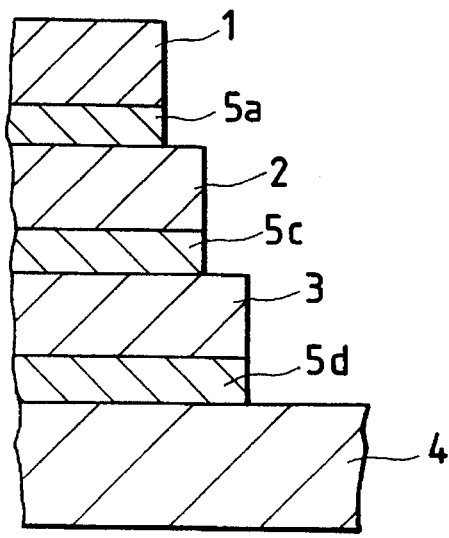
FIG. 11 is partially enlarged side vertical cross section showing the condition of the electronic device of the present invention before the temperature rises.
Figure 12:
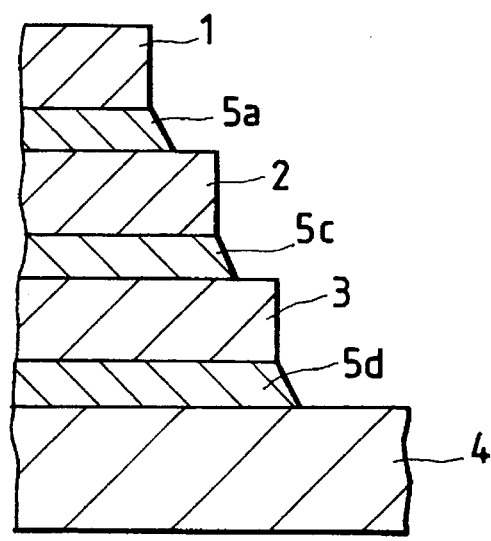
FIG. 12 is partially enlarged side vertical cross section showing the condition of the electronic device of the present invention after the temperature rises.

In the electronic device of this invention, on the other hand, the composite material plate 3 is inserted between the base 4 and the insulating plate 2, as shown in FIGS. 11 and 12. The base 4 and the composite material plate 3 are joined together by solder 5d, and the composite material plate 3 and the insulating plate 2 are joined by solder 5c. The composition of the materials that make up the composite material plate 3 is so adjusted that the composite material has an appropriate linear expansion coefficient. Therefore, as is apparent from FIGS. 11 and 12, the thermal expansion difference between the base 4 and the insulating plate 2 is absorbed by two separate solders 5d and 5c, the solder 5d connecting the base 4 and the composite material plate 3 and the solder 5c joining the composite material plate 3 and the insulating plate 2.

Figure 10:
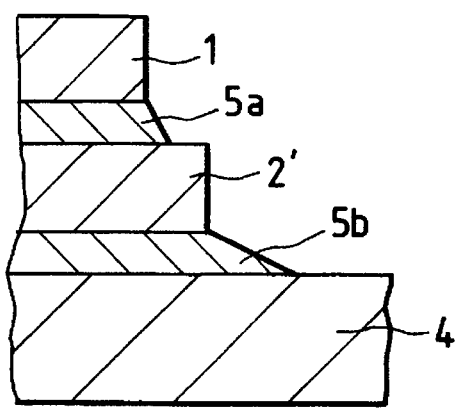
FIG. 10 is partially enlarged side vertical cross section showing the condition of the conventional electronic device after the temperature rises.

Comparison of FIGS. 10 and 12 clearly indicates that the electronic device of this embodiment using the composite material plate can make the maximum strain of the solder significantly smaller than that produced in the conventional electronic device. Since the life of the solder depends on the maximum strain of the solder, the reduction in the maximum strain results in a delay in the fatigue fracture, prolonging the life of the solder.

The above phenomenon will be detailed in the following.

In the conventional electronic device shown in FIGS. 9 and 10, the strain $\Delta\gamma_{5b}$ of the solder $5b$ is given by $$\Delta\gamma_{5b} \propto \alpha_4 - \alpha_2 \quad (2)$$

where $\alpha_2$: linear expansion coefficient of the insulating plate; and $\alpha_4$: linear expansion coefficient of the base.

In the electronic device of this invention, the strains $\Delta\gamma_{5c}$, $\Delta\gamma_{5d}$ of the solders $5c$, $5d$ shown in FIGS. 11 and 12 are given by $$\Delta\gamma_{5c} \propto \alpha_3 - \alpha_2 \quad (3)$$

$$\Delta\gamma_{5d} \propto \alpha_4 - \alpha_3 \quad (4)$$

where $\alpha_3$: linear expansion coefficient of the composite material plate.

The linear expansion coefficient $\alpha_3$ of the composite material plate 3 is expressed as follows according to the combination law.

$$\alpha_3 = \frac{E_a h_a \alpha_a + E_b h_b \alpha_b}{E_a h_a + E_b h_b} \quad (5)$$

where $h_a$, $h_b$, $E_a$, $E_b$, $\alpha_a$, and $\alpha_b$ are as defined in equation (1).

Figure 13:
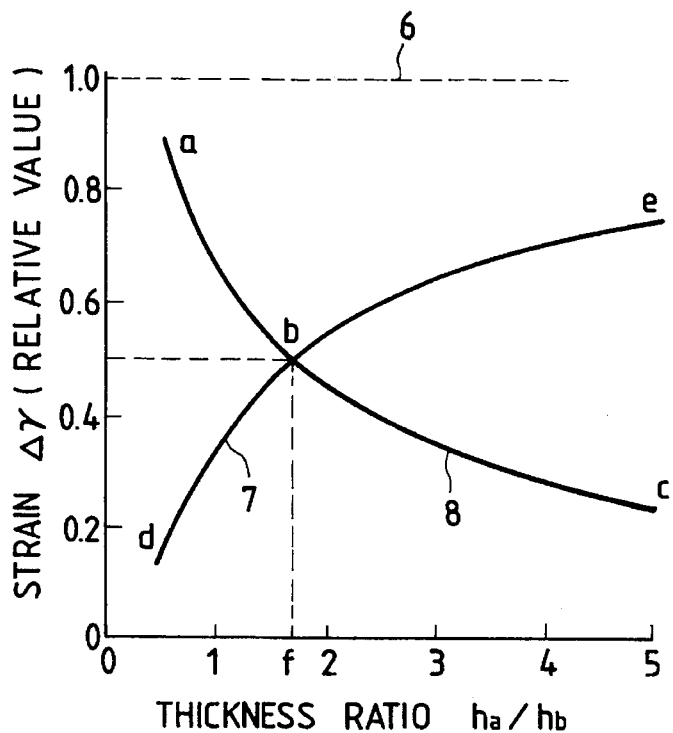
FIG. 13 is a graph showing the strain of a solder in the conventional electronic device in which the base and the insulating plate are directly joined by the solder, and also the relationship between the strain of a solder and the thickness ratio of different materials in a composite material plate in the electronic device of this invention in which the base and the insulating plate are joined with the composite material plate interposed.

From the above equations, the strains of the solders are determined as shown in FIG. 13. In FIG. 13, a dashed line 6 represents the strain of the solder $5b$ in the conventional electronic device and curves 7, 8 indicate the strains of the solders $5c$, $5d$ of FIGS. 11 and 12 used in this embodiment. From FIG. 13, it is seen that the electronic device of this embodiment with the composite material plate 3 inserted between the base 4 and the insulating plate 2 can reduce the strain of the solder from that in the conventional electronic device as seen from FIG. 13 in which the curves 7 and 8 are under the dashed line 6. It is also seen that as the thickness ratio of materials in the composite material plate 3 is changed, the strain of the solder $5c$ joining the insulating plate 2 and the composite material plate 3 and the strain of the solder $5d$ joining the composite material plate 3 and the base 4 change in such a manner that one of them increases while the other decreases.

The Manson-Coffin's law states that the fatigue life N is expressed as $$N \propto 1/\Delta\gamma^2 \quad (6)$$

where $\Delta\gamma$: maximum strain.

Figure 14:
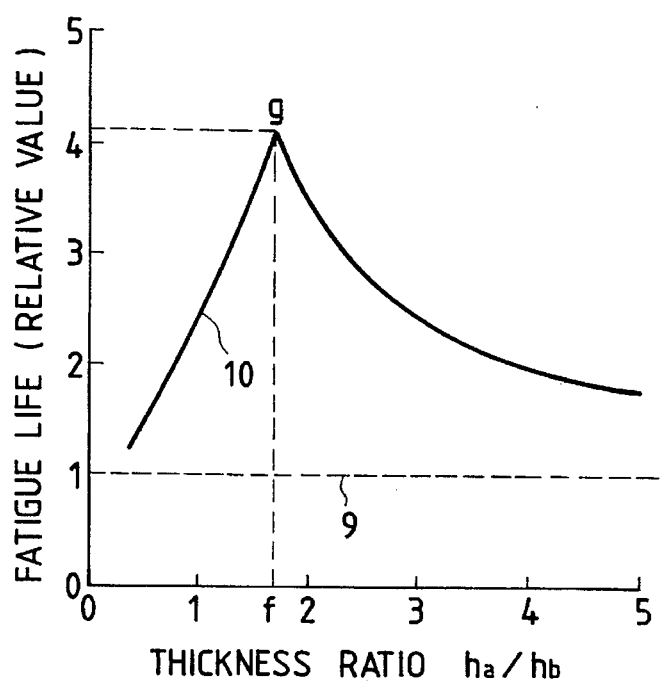
FIG. 14 is a graph showing the fatigue life of a solder in the conventional electronic device in which the base and the insulating plate are directly joined by the solder, and also the relationship between the fatigue life of a solder and the thickness ratio of different materials in a composite material plate in the electronic device of this invention in which the base and the insulating plate are joined with the composite material plate interposed.

Using the strains of FIG. 13 and equation (5), we obtain the relationship shown in FIG. 14. In FIG. 14, a dashed line 9 represents the fatigue life of the conventional electronic device and a curved line 10 represents that of the electronic device of this invention. The fatigue life indicated by the curve 10 is obtained by substituting into the equation (6) the strain indicated by the curve 7 or 8, whichever is greater. Herein, suppose that the thickness ratio of the plates in which the strain shown by 7 is equal to that shown by 8 is indicated by f, the strain of the solder $5c$ is shown by the curve d-b-e, and the strain of the solder $5d$ is shown by the curve a-b-c in FIG. 13. The curve a-b in the case that the thickness ratio is smaller than the thickness ratio of f and the curve b-e in the case that the thickness ratio is larger than the thickness ratio of f stand for the larger strain among the curves 7 and 8 in the above explanation. FIG. 14 shows that the fatigue life of the electronic device of this invention is longer than that of the conventional electronic device and that the improvement rate of the fatigue life can be made the maximum possible value by selecting an appropriate thickness ratio $h_a/h_b$ for the composite material plate. The thickness ratio f in FIG. 14 corresponds to that shown in FIG. 13. It is also seen from FIG. 13 that at the maximum fatigue life point, the strain of the solder joining the insulating plate and the composite material plate is equal to the strain of the solder joining the composite material plate and the base. That is, at this point $$\Delta\gamma_{5c} = \Delta\gamma_{5d} \quad (7)$$

Substituting the preceding equations (3), (4) and (5) into this equation (7) yields the equation (1).

With the materials of the insulating plate 2, the composite material plate 3 and the base 4 chosen, the linear expansion coefficients and the moduli of longitudinal elasticity of these selected materials are substituted in the equation (1) to determine the thickness ratio $h_a/h_b$ of the composite material plate 3, as already explained in (i) to (iv). From the thickness ratio $h_a/h_b$ thus obtained, the actual thickness of each plate of the composite material plate 3 is determined.

Instead of using a clad plate as the composite material plate, a coefficient-graded material plate may be employed. The coefficient-graded material plate has at one of its surfaces a linear expansion coefficient close to that of the base 4 and, at the other surface, the coefficient is close to that of the insulating plate 2, with the intermediate portion gradually changing the linear expansion coefficient. With this coefficient-graded material plate, it is possible to further extend the fatigue life.

Figure 15:
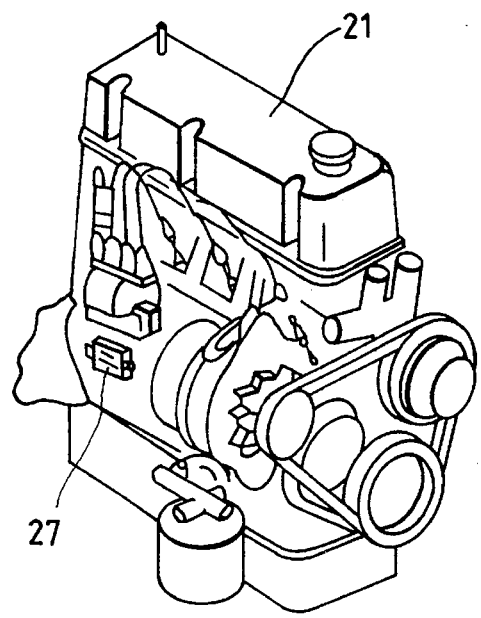
FIG. 15 is a perspective view showing the electronic device of this invention mounted to an engine body when the device is used as a power switch for an automotive engine ignition apparatus.
Figure 16:
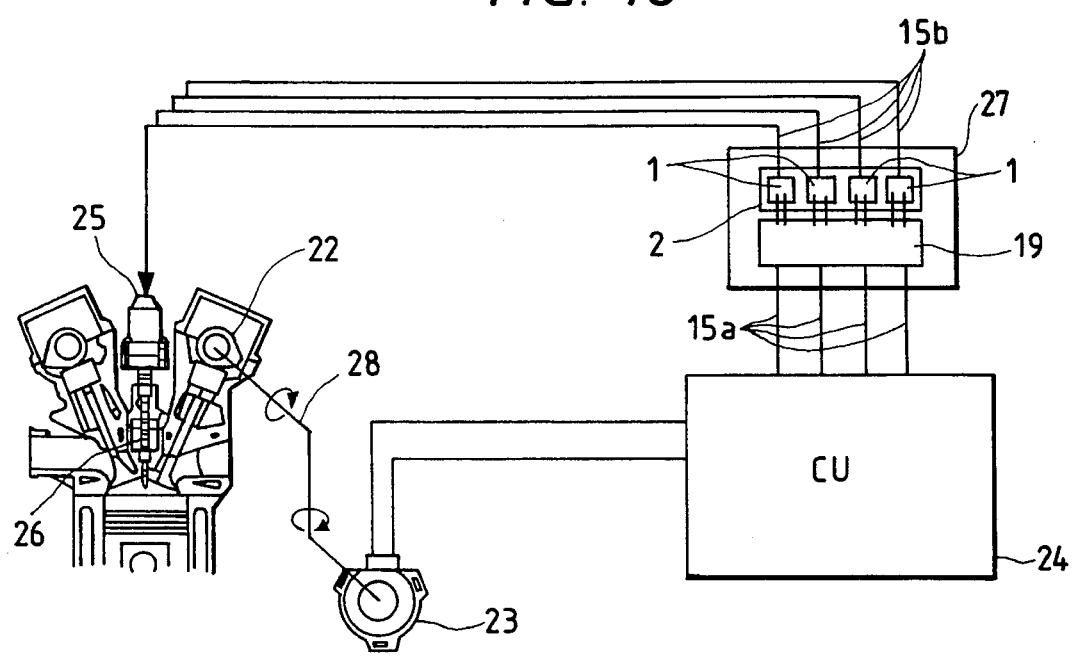
FIG. 16 is a system diagram showing the connection between the power switch and the parts of the engine.

FIG. 15 is a perspective view of an automotive engine showing the electronic device of this invention attached to the engine body when it is used as a power switch for the ignition apparatus of the engine. FIG. 16 is a schematic diagram showing the connection between the parts of the engine and the power switch.

The engine shown in these figures consists of: an engine body 21; a cam 22 for the engine; a crank angle sensor 23 for detecting the rotating angle of the cam 22; a control unit 24 for generating an ignition timing control signal according to the detected rotating angle of the cam; an ignition coil 25 for applying a high voltage to the ignition plug 26; and a power switch 27 for supplying large current pulses to the ignition coil 25. The engine has four cylinders.

The power switch 27 employs the electronic device of this invention and is directly mounted to the engine body 21. The wiring plate 19 of the power switch 27 is connected to the control unit 24. The power switch 27 has four chips 1, each of which is connected to the corresponding ignition coil 25. The configuration of the power switch in other respects is the same as that of the above-mentioned electronic device.

In the engine of this embodiment, the rotating angle of the cam 22 is detected by the crank angle sensor 23 and fed to the control unit 24.

According to the angle measured by the crank angle sensor 23, the control unit 24 generates the ignition timing control signal, which is fed to the wiring plate 19 of the power switch 27.

The wiring plate 19 mounts electronic circuits including the small-signal electronic parts (not shown in FIGS. 15 and 16), which turn on and off the current flowing to the ignition coils 25 through the terminals $15b$ connected to the chips 1. When the ignition coil 25 selected by the ignition timing control signal is turned on, a large pulse current is supplied to the ignition coil 25 through the corresponding chip 1.

This produces a high voltage at the ignition plug 26 generating an arc at an appropriate timing to fire the engine.

In this operating condition of the power switch 27, a large amount of heat is produced in the chip 1. With the electronic device of this invention, all the chips 1 are mounted on a single insulating plate 2, so that the heat produced in the chip 1 is diffused and absorbed into a large volume of the insulating plate 2, preventing an excessive temperature rise and therefore the performance deterioration of the chip 1. Furthermore, this invention minimizes the reciprocal motion of the insulating plate 2 with respect to the wiring plate 19, which would result from the temperature rise and fall. This in turn significantly reduces the repetitive load on the wires that connect the electronic circuits including the small-signal electronic parts on the wiring plate and the chips of the insulating plate, contributing to extending the fatigue life of the wires.

When the power switch 27 is used in high temperature environment in the engine room, the provision of the composite material plate between the base 4 and the insulating plate 2 allows the thermal expansion difference between the base and the insulating plate to be absorbed by the composite material plate, as mentioned earlier. Therefore, the fatigue fracture due to repetitive strain of the solder between the base and the insulating plate 2 can be prevented, thus prolonging the life of the solder significantly.

The life of the solder between the base and the insulating plate can further be extended by inserting between the base and the insulating plate 2 a clad plate as a composite material plate formed of a combination of properly chosen materials, or a clad plate as a composite material plate with a specific thickness ratio, or a coefficient-graded material plate whose linear expansion coefficient gradually changes from one side to the other. These features of the power switch are the same as those of the electronic device of the above embodiment.

According to the first means for attaining the first object of the present invention, since all the necessary chips are mounted on a single insulating plate joined to the base, the heat pulse generated in the chips is dissipated into a large volume of the insulating plate, minimizing the temperature rise and thereby preventing the performance degradation of the chips due to heat. In addition, it is possible to greatly reduce the repetitive load on the wires connecting the electronic circuit on the wiring plate to the chips on the insulating plate, the repetitive load being generated by the insulating plate reciprocally moving relative to the wiring plate as the temperature rises and falls. Thus, the fatigue life of the wires can be prolonged.

According to the second means for attaining the first object of the present invention, a single wiring plate and a single insulating plate are joined to the base, all the necessary small-signal electronic parts are mounted on the wiring plate to form electronic circuits, and the electronic circuits including the small-signal electronic parts are connected through wires to the chips. In this invention also, the heat generated in the chips can be dissipated and absorbed into a large volume of the insulating plate. This prevents performance deterioration of the chips due to heat and also minimizes the repetitive load to which the wires connecting the electronic circuits on the wiring plate to the chips on the insulating plate are subjected and which is caused by the insulating plate reciprocally moving relative to the wiring plate as the temperature rises and falls. As a result, the fatigue life of the wires can be extended.

According to the first means for attaining the second object of the present invention, a composite material plate made up of materials with different linear expansion coefficients is inserted between the base and the insulating plate in joining the latter two members. The base and the insulating plate are formed of materials with different linear expansion coefficients. The insulating plate is so formed as to be able to absorb the heat of the chips and, even when the temperature rises, the composite material plate can absorb the thermal expansion difference between the base and the insulating plate, thus minimizing the repetitive strain of a joining portion of the base and the insulating plate that would otherwise be caused by the thermal expansion difference of the latter two members. Hence, the fatigue life of the joining portion between the base and the insulating plate can be drastically extended.

According to the second means for attaining the second object of the present invention, the base and the composite material plate are joined by solder, and the insulating plate and the composite material are also joined by solder. The combination of different materials in the composite material plate is so set that the strain of a solder between the base and the composite material plate is equal to the strain of a solder between the insulating plate and the composite material plate. According to the third means for attaining the second object, the composite material plate is formed of a combination of a material with a large linear expansion coefficient and a material with a small linear expansion coefficient. The thickness ratio $h_a/h_b$ between the thickness $h_a$ of the material with a large linear expansion coefficient and the thickness $h_b$ of the material with a small linear expansion coefficient is determined by a formula involving the moduli of longitudinal elasticity and linear expansion coefficient of the materials making up the composite material plate, and the linear expansion coefficients of the insulating plate and the base. According to the fourth means for attaining the second object of the present invention, the base is formed of Cu and the insulating plate is formed of AlN. A clad plate, which consists of Cu plates and an INVAR plate with a thickness ratio between the Cu plate and the INVAR plate in the range of 1.3 to 2.3, is inserted between the base and the insulating plate. And the base and the insulating plate are joined together with the clad plate interposed therebetween. According to the fifth means for attaining the second object of the present invention, the base is formed of Al and the insulating plate is formed of AlN. At the same time, a clad plate, which consists of Cu plates and an INVAR plate with the thickness ratio between the Cu plate and the INVAR plate in the range of 4 to 11, is inserted between the base and the insulating plate. And the base and the insulating plate are joined together with the clad plate interposed therebetween. Further, according to the sixth means for attaining the second object of the present invention, a coefficient-graded material plate is inserted between the base and the insulating plate. The linear expansion coefficient of the coefficient-graded material plate is, on one side near the base, close to that of the base and, on the other side near the insulating plate, close to that of the insulating plate. The linear expansion coefficient is gradually changed in an intermediate region between the two sides. The base and the insulating plate are joined together with this coefficient-graded material plate interposed therebetween. This arrangement greatly reduces the strain of the solder between the base and the insulating plate even when the base and the insulating plate are formed of materials with different linear expansion coefficients, further extending the fatigue life of the solder subjected to repetitive strains.

Further, according to the invention for attaining the third object, the electronic device of any one of the invention mentioned above is used as a power switch, in which the chips are separately connected to the corresponding ignition coils. The heat generated in the chips is allowed to flow into a large volume of the insulating plate and is thereby dissipated, preventing the performance deterioration of the chips. The heat dissipation or absorption makes it also possible to minimize the repetitive load applied to the wires connecting the electronic circuits on the wiring plate to the chips on the insulating plate, thereby extending the fatigue life of the wires. The invention, in which the base and the insulating plate are joined together with a composite material or coefficient-graded material plate interposed, has the following advantage. When the base and the insulating plate are formed of materials with different linear expansion coefficients and the power switch is installed in a high-temperature environment in the engine room and when the heat generated in the chip flows into the insulating plate, the thermal expansion difference between the base and the insulating plate is adequately absorbed by the composite material plate or the coefficient-graded material plate. As a result, the fatigue life of the solder between the base and the insulating plate, subjected to the repetitive strain, can be extended to a great extent.

What we claim is:

1. An electronic device comprising:

a heat conducting base;

a single insulating plate bonded to said base;

a plurality of power semiconductor chips mounted on said single insulating plate, said chips repetitively producing a pulse of heat; and a wiring plate, having a width greater than that of said single insulating plate, being mounted on said base for electrically connecting said chips to a control circuit by wires, said single insulating plate and said wiring plate being so arranged on said base that the centers of said single insulating plate and said wiring plate are aligned with each other along a line corresponding to an axis of said single insulating plate and perpendicular to the width direction thereof, whereby deformation of the single insulating plate from heat produced by said semiconductor chips is avoided.

2. An electronic device according to claim 1, wherein said base and said insulating plate are joined together with a composite material plate interposed therebetween, said composite material plate being comprised of layers of a large linear expansion coefficient material and a layer of a small linear expansion coefficient material.

3. An electronic device according to claim 2, wherein a solder is used to join facing surfaces of said base and said composite material plate, and a thickness ratio of layers which comprise said composite material plate is so selected that a strain of the solder between said base and said composite material plate is equal to the strain of the solder between said insulating plate and said composite material plate.

4. An electronic device according to claim 2, wherein a thickness ratio $h_a/h_b$ between the thickness of the layers with the large linear expansion coefficient $h_a$ and the thickness of the layer with the small linear expansion coefficient $h_b$ is set as follows:

$$\frac{h_a}{h_b} = \frac{E_b(\alpha_2 + \alpha_4 - 2\alpha_b)}{E_a(2\alpha_a - \alpha_2 - \alpha_4)}$$

where $E_a$: modulus of longitudinal elasticity of the large linear expansion coefficient material of said composite material plate;

$E_b$: modulus of longitudinal elasticity of the small linear expansion coefficient material of said composite material plate;

$\alpha_a$: linear expansion coefficient of the large linear expansion coefficient material of said composite material plate;

$\alpha_b$: linear expansion coefficient of the small linear expansion coefficient material of said composite material plate;

$\alpha_2$: linear expansion coefficient of said insulating plate; and $\alpha_4$: linear expansion coefficient of said base.

5. An electronic device according to claim 1, wherein said base is comprised of copper, said insulating plate is comprised of aluminum nitride, and said base and said insulating plate are joined together with a clad plate interposed therebetween, said clad plate being comprised of copper plates and a low-expansion alloy plate with a thickness ratio between the copper plates and the low-expansion alloy plate in a range of 1.3 to 2.3.

6. An electronic device according to claim 5, wherein said low-expansion alloy plate is comprised of 36% nickel, 0.35% manganese, and the balance of iron with carbon and other elements.

7. An electronic device according to claim 1, wherein said base is comprised of aluminum, said insulating plate is comprised of aluminum nitride, and said base and said insulating plate are joined together with a clad plate interposed therebetween, said clad plate being comprised of copper plates and a low-expansion alloy plate with a thickness ratio between the copper plates and the low-expansion alloy plate in a range of 4 to 11.

8. An electronic device according to claim 7, wherein said low-expansion alloy plate is comprised of 36% nickel, 0.35% manganese, and the balance of iron with carbon and other elements.

9. An electronic device according to claim 1, wherein the insulating plate is comprised of aluminum nitride (AlN).

10. An electronic device comprising:

a heat conducting base;

a single insulating plate soldered to said base;

a plurality of power semiconductor chips mounted on said single insulating plate, said chips repetitively producing a pulse of heat;

a wiring plate, having a width greater than that of said single insulating plate, being mounted on said base for electrically connecting said chips to a control circuit by wires, said single insulating plate and said wiring plate being so arranged on said base that the centers of said single insulating plate and said wiring plate are aligned with each other along a line corresponding to an axis of said single insulating plate and perpendicular to the width direction thereof, whereby deformation of the single insulating plate from heat produced by said semiconductor chips is avoided; and ignition coils connected to said power semiconductor chips for passing a pulse current thereto.

11. An electronic device comprising:

a heat conducting base;

a single insulating plate soldered to said base;

a plurality of power semiconductor chips mounted on said single insulating plate, said chips repetitively producing a pulse of heat;

a wiring plate, having a width greater than that of said single insulating plate, being mounted on said base for electrically connecting said chips to a control circuit by wires, said single insulating plate and said wiring plate being so arranged on said base that the centers of said single insulating plate and said wiring plate are aligned with each other along a line corresponding to an axis of said single insulating plate and perpendicular to the width direction thereof, whereby deformation of the single insulating plate from heat produced by said semiconductor chips is avoided;

a composite material plate interposed between said base and said insulating plate, said composite material plate being comprised of layers of a large linear coefficient material and a layer of a small linear expansion coefficient material; and ignition coils connected to said power semiconductor chips for passing a pulse current thereto.

12. An electronic device comprising:

a heat conducting base;

a single insulating plate soldered to said base;

a plurality of power semiconductor chips mounted on said single insulating plate, said chips repetitively producing a pulse of heat;

a wiring plate, having a width greater than that of said single insulating plate, being mounted on said base for electrically connecting said chips to a control circuit by wires, said single insulating plate and said wiring plate being so arranged on said base that the centers of said single insulating plate and said wiring plate are aligned with each other along a line corresponding to an axis of the single insulating plate and perpendicular to the width direction thereof, whereby deformation of the single insulating plate from heat produced by said semiconductor chips is avoided;

a composite material plate interposed between said base and said insulating plate, said composite material plate being comprised of layers of a large linear coefficient material and a layer of a small linear expansion coefficient material;

a solder which joins facing surfaces of said base and said composite material plate, a thickness ratio of layers which comprise said composite material plate being selected so that a strain of the solder between said base and said composite material plate is equal to the strain of the solder between said insulating plate and said composite material plate; and ignition coils connected to said power semiconductor chips for passing a pulse current thereto.

13. An electronic device comprising:

a heat conducting base;

a single insulating plate soldered to said base;

a plurality of power semiconductor chips mounted on said single insulating plate, said chips repetitively producing a pulse of heat;

a wiring plate, having a width greater than that of said single insulating plate, being mounted on said base for electrically connecting said chips to a control circuit by wires, said single insulating plate and said wiring plate being so arranged on said base that the centers of said single insulating plate and said wiring plate are aligned with each other along a line corresponding to an axis of said single insulating plate and perpendicular to the width direction thereof, whereby deformation of the single insulating plate from heat produced by said semiconductor chips is avoided;

ignition coils connected to said power semiconductor chips for passing a pulse current thereto;

a composite material plate interposed between said base and said insulating plate, said composite material plate being comprised of a layer of a large linear coefficient material and a layer of a small linear coefficient expansion coefficient material, wherein a thickness ratio $h_a/h_b$ between the thickness of the layers with the large linear expansion coefficient $h_a$ and the thickness of the layer with the small linear expansion coefficient $h_b$ is set as follows:

$$\frac{h_a}{h_b} = \frac{E_b(\alpha_2 + \alpha_4 - 2\alpha_b)}{E_a(2\alpha_a - \alpha_2 - \alpha_4)}$$

where $E_a$: modulus of longitudinal elasticity of the large linear expansion coefficient material of said composite material plate;

$E_b$: modulus of longitudinal elasticity of the small linear expansion coefficient material of said composite material plate;

$\alpha_a$: linear expansion coefficient of the large linear expansion coefficient material of said composite material plate;

$\alpha_b$: linear expansion coefficient of the small linear expansion coefficient material of said composite material plate;

$\alpha_2$: linear expansion coefficient of said insulating plate; and $\alpha_4$: linear expansion coefficient of said base; and ignition coils connected to said power semiconductor chips for passing a large pulse current thereto.

14. An electronic device in which a wiring plate and an insulating plate are connected to a copper base, comprising:

a single insulating plate comprised of aluminum nitride connected to said base;

a plurality of power semiconductor chips mounted on said single insulating plate, wherein said single insulating plate has a narrower width than that of said wiring plate and is so arranged on said base that the centers of said base and said single insulating plate are aligned with each other along a line corresponding to an axis of the single insulating plate and perpendicular to the width direction of both said single insulating plate and said wiring plate, whereby deformation of the single insulating plate from heat produced by said semiconductor chips is avoided;

a clad plate interposed between said base and said insulating plate, said clad plate being comprised of copper plates and a low-expansion alloy plate, with a thickness ratio between the copper plates and the low-expansion alloy plate being in a range of 1.3 to 2.3; and ignition coils connected to said power semiconductor chips for passing a pulse current thereto.

15. An electronic device according to claim 14, wherein said low-expansion alloy plate is comprised of 36% nickel, 0.35% manganese, and the balance of iron with carbon and other elements.

16. An electronic device in which a wiring plate and an insulating plate are connected to an aluminum base, comprising:

a single insulating plate made of aluminum nitride connected to said base;

a plurality of power semiconductor chips mounted on said single insulating plate, wherein said single insulating plate has a narrower width than that of said wiring plate and is so arranged on said base that the centers of said base and said single insulating plate are aligned with each other along a line corresponding to an axis of the single insulating plate and perpendicular to the width direction of both said single insulating plate and said wiring plate, whereby deformation of the single insulating plate from heat produced by said semiconductor chips is avoided;

a clad plate which is interposed between said base and said insulating plate, said clad plate being comprised of copper plates and a low-expansion alloy plate, with a thickness ratio between the copper plates and the low-expansion alloy plate being in a range of 4 to 11; and ignition coils connected to said power semiconductor chips for passing a pulse current thereto.

17. An electronic device according to claim 16, wherein said low-expansion alloy plate is comprised of 36% nickel, 0.35% manganese, and the balance of iron with carbon and other elements.

18. A method of making an electronic device comprising:

bonding a single insulating plate bonded to a heat conducting base;

mounting a plurality of power semiconductor chips on said single insulating plate, said chips repetitively producing a pulse of heat;

mounting a wiring plate on said base for electrically connecting said chips to a control circuit by wires, said wiring plate having a width greater than that of said single insulating plate; and aligning said single insulating plate and said wiring plate on said base so that the centers of said insulating plate and said wiring plate are located along a line corresponding to an axis of said single insulating plate and perpendicular to the width direction thereof.

19. A method of making an electronic device comprising:

soldering a single insulating plate to a heat conducting base;

mounting a plurality of power semiconductor chips on said single insulating plate, said chips repetitively producing a large pulse of heat;

mounting a wiring plate on said base for electrically connecting said chips to a control circuit by wires, said wiring plate having a width greater than that of said single insulating plate;

aligning said single insulating plate and said wiring plate on said base so that the centers of said single insulating plate and said wiring plate are located along a line corresponding to an axis of said single insulating plate and perpendicular to the width direction thereof; and interposing a coefficient-graded material plate between said base and said insulating plate, one side of said coefficient-graded material plate near said base having a linear expansion coefficient close to that of said base and, the other side of said coefficient-graded material plate near said insulating plate having a linear expansion coefficient close to that of said insulating plate, and the intermediate portion of said coefficient-graded material plate between the two sides having the linear expansion coefficient gradually changed.

20. A method according to claim 19, further comprising soldering facing surfaces of said base and said composite material plate, wherein a thickness ratio of layers which comprise said composite material plate being selected so that a strain of the solder between said base and said composite material plate is equal to the strain of the solder between said insulating plate and said composite material plate.

* * * * *